United States Patent
Zhou et al.

(10) Patent No.: US 10,411,710 B1
(45) Date of Patent: Sep. 10, 2019

(54) ADAPTIVE READ SCHEME FOR CONFIGURATION SRAMS IN A PROGRAMMABLE DEVICE

(71) Applicant: Xilinx, Inc., San Jose, CA (US)

(72) Inventors: Shidong Zhou, Milpitas, CA (US); Sree RKC Saraswatula, Hyderabad (IN); Jing Jing Chen, San Jose, CA (US); Teja Masina, Hyderabad (IN); Narendra Kumar Pulipati, Hyderabad (IN); Santosh Yachareni, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/211,149

(22) Filed: Dec. 5, 2018

(51) Int. Cl.
*H03K 19/177* (2006.01)

(52) U.S. Cl.
CPC ... *H03K 19/17736* (2013.01); *H03K 19/1776* (2013.01); *H03K 19/17728* (2013.01)

(58) Field of Classification Search
CPC ......... H03K 19/17736; H03K 19/1776; H03K 19/17728
USPC .......................................................... 326/39
See application file for complete search history.

(56) References Cited

U.S. PATENT DOCUMENTS

| | | | | |
|---|---|---|---|---|
| 5,345,573 A | * | 9/1994 | Bowden, III | G06F 12/0879 365/189.02 |
| RE37,195 E | | 5/2001 | Kean | |
| 6,816,955 B1 | * | 11/2004 | Raza | G06F 13/1605 365/230.05 |
| 6,948,147 B1 | | 9/2005 | New et al. | |
| 7,016,349 B1 | * | 3/2006 | Raza | H04L 49/90 370/390 |
| 7,023,744 B1 | | 4/2006 | Shimanek et al. | |
| 7,126,372 B2 | | 10/2006 | Vadi et al. | |
| 7,233,532 B2 | | 6/2007 | Vadi et al. | |
| 7,314,174 B1 | | 1/2008 | Vadi et al. | |
| 7,535,254 B1 | | 5/2009 | Case | |
| 7,711,933 B1 | | 5/2010 | Lysaght | |
| 7,912,693 B1 | | 3/2011 | Han et al. | |
| 8,183,881 B1 | | 5/2012 | Stassart et al. | |
| 2002/0004881 A1 | * | 1/2002 | Iijima | G06F 13/1689 711/105 |
| 2015/0092492 A1 | * | 4/2015 | Matsumoto | G11C 16/3431 365/185.11 |

* cited by examiner

*Primary Examiner* — Don P Le
(74) *Attorney, Agent, or Firm* — Robert M. Brush

(57) ABSTRACT

An example read address generation circuit for a static random access memory (SRAM) cell includes an operational amplifier having a non-inverting input coupled to a reference voltage, a memory emulation circuit having an output coupled to an inverting input of the operational amplifier and a control input coupled to an output of the operational amplifier, and a multiplexer having a first input coupled to receive a constant read voltage, a second input coupled to the output of the operational amplifier, and an output coupled to supply a read address voltage to the SRAM cell.

20 Claims, 7 Drawing Sheets

ADAPTIVE READ SCHEME FOR CONFIGURATION SRAMS IN A PROGRAMMABLE DEVICE

TECHNICAL FIELD

Examples of the present disclosure generally relate to electronic circuits and, in particular, to configuration static random access memories (SRAMs) in a programmable device.

BACKGROUND

Programmable logic devices (PLDs) are a well-known type of digital integrated circuit that may be programmed by a user (e.g., a circuit designer) to perform specified logic functions. PLDs typically include an array of configurable logic elements that are programmably interconnected to each other and to programmable input/output blocks via some form of programmable interconnect. This collection of configurable logic may be customized by loading configuration data into internal configuration memory cells that define how the logic elements, interconnect, and input/output blocks are configured. The configuration memory is typically implemented using static random access memory (SRAM). Presently, the address voltage for SRAM memory cells in a PLD is held constant across process, voltage and temperature (PVT). However, in some cases, a flat address supply voltage during read has significantly reduced the voltage difference between read and read margin across PVT. There exists a need for a new read scheme for SRAM memory cells in a programmable device, such as a PLD.

SUMMARY

Techniques for providing an adaptive read scheme for configuration SRAMs in a programmable device are described. In an example, a read address generation circuit for a static random access memory (SRAM) cell includes: an operational amplifier having a non-inverting input coupled to a reference voltage; a memory emulation circuit having an output coupled to an inverting input of the operational amplifier and a control input coupled to an output of the operational amplifier; and a multiplexer having a first input coupled to receive a constant read voltage, a second input coupled to the output of the operational amplifier, and an output coupled to supply a read address voltage to the SRAM cell.

In another example, a circuit includes: a static random access memory (SRAM) cell having an address input; an operational amplifier having a non-inverting input coupled to a reference voltage; a memory emulation circuit having an output coupled to an inverting input of the operational amplifier and a control input coupled to an output of the operational amplifier; and a multiplexer having a first input coupled to receive a constant read voltage, a second input coupled to the output of the operational amplifier, and an output coupled to the address input of the SRAM cell.

In another example, a programmable device includes: programmable logic; configuration memory; configuration logic configured to load data into the configuration memory for programming the programmable logic; a static random access memory (SRAM) cell in the configuration memory; an operational amplifier having a non-inverting input coupled to a reference voltage; a memory emulation circuit having an output coupled to an inverting input of the operational amplifier and a control input coupled to an output of the operational amplifier; and a multiplexer having a first input coupled to receive a constant read voltage, a second input coupled to the output of the operational amplifier, and an output coupled to the address input of the SRAM cell.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
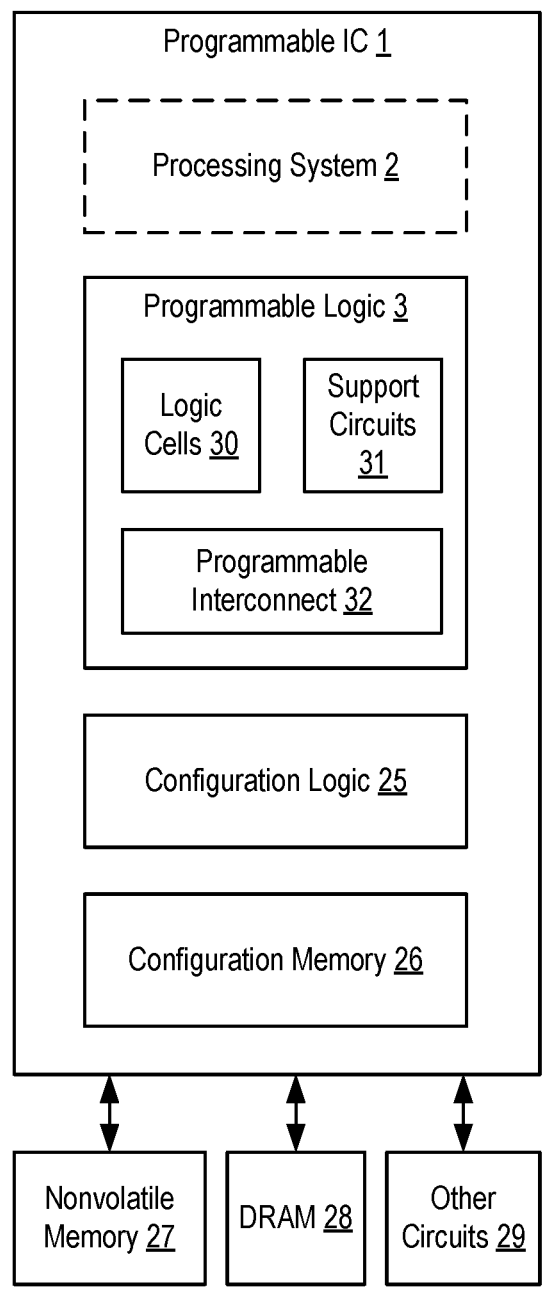
FIG. 1 is a block diagram depicting a programmable IC according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Figure 5:
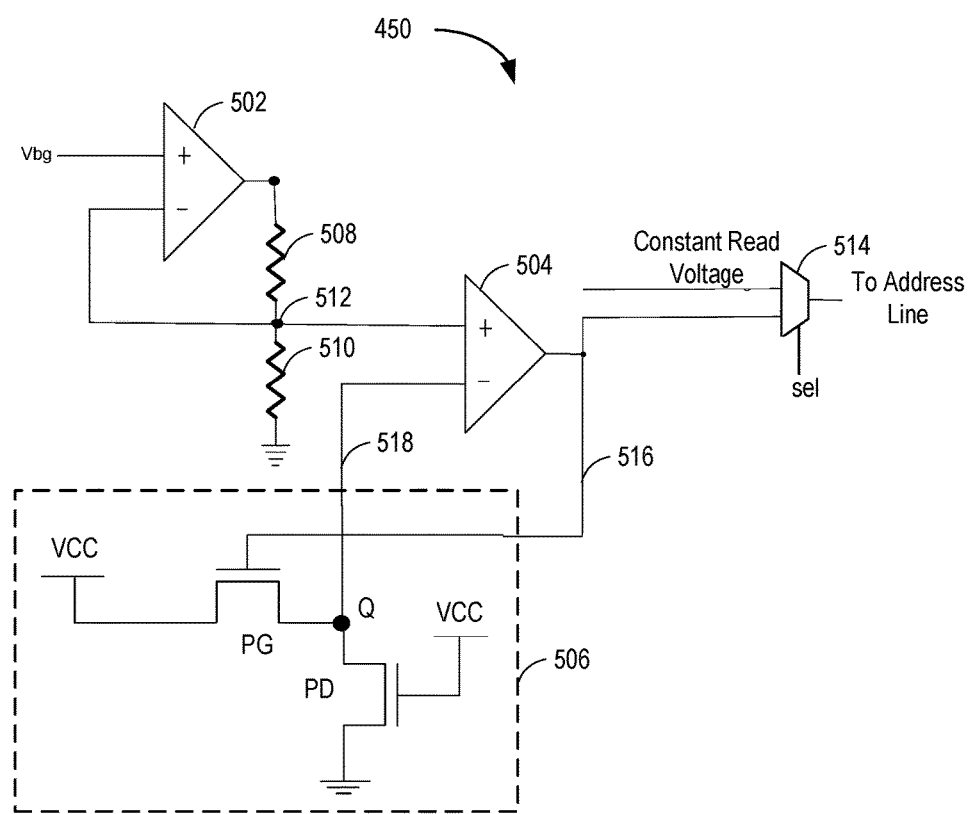
FIG. 5 is a schematic diagram depicting an adaptive read voltage generation circuit according to an example.

FIG. 1 is a block diagram depicting a programmable IC 1 according to an example. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like. It should be understood that the techniques described herein can be implemented using a single IC (e.g., a programmable IC), an SoC (e.g., as shown in FIG. 5 and described below), or in a multi-chip system, where processors, memories, and programmable ICs are separate devices. In all cases, communication among the hardware components into the programmable IC (or programmable logic of an SoC) connect into the shell circuit, as described above.

Figure 2:
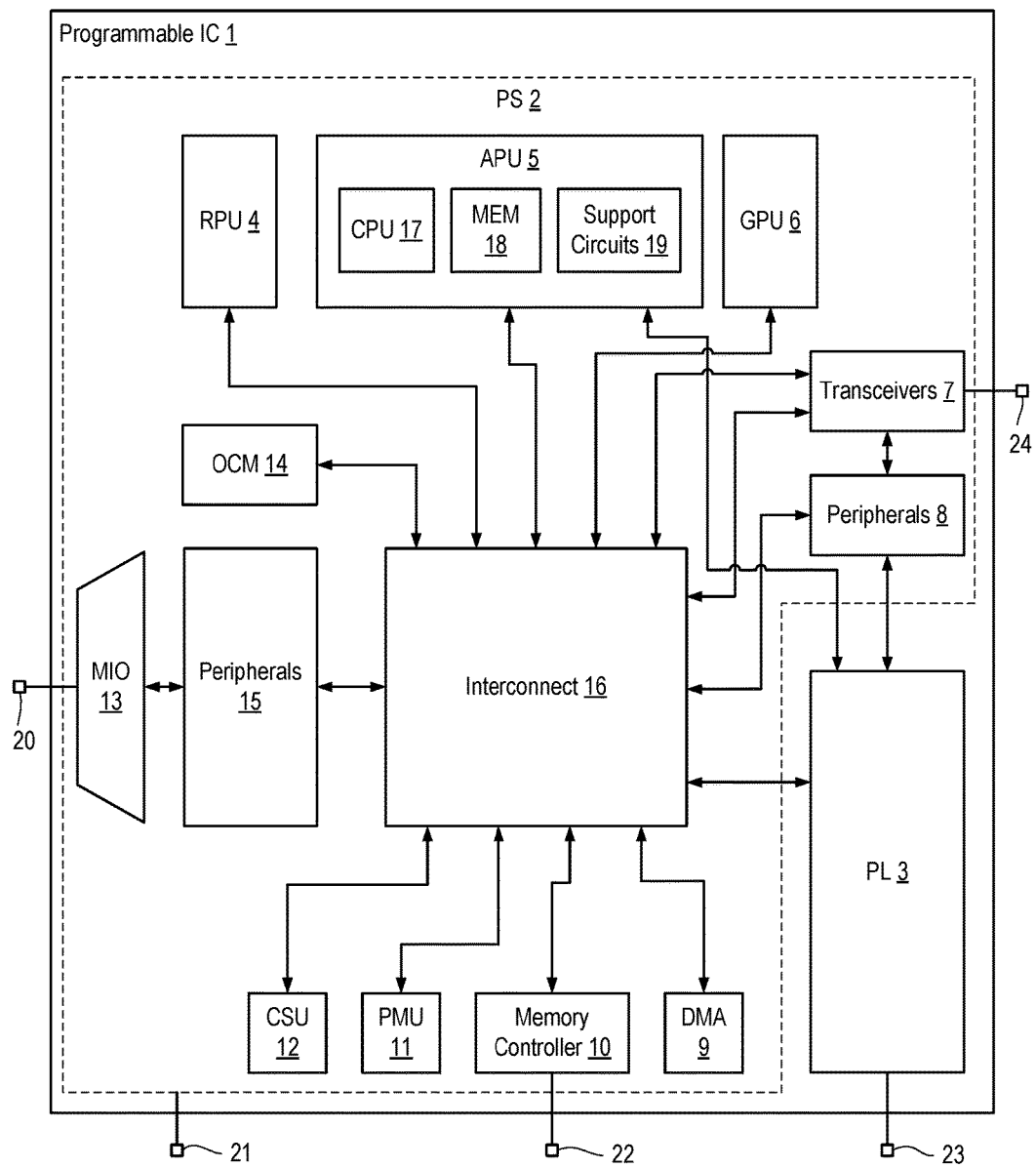
FIG. 2 is a block diagram depicting a System-on-Chip (SoC) implementation of the programmable IC of FIG. 1 according to an example.

FIG. 2 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SER-DES) circuits, MGTs, and the like.

Figure 3:
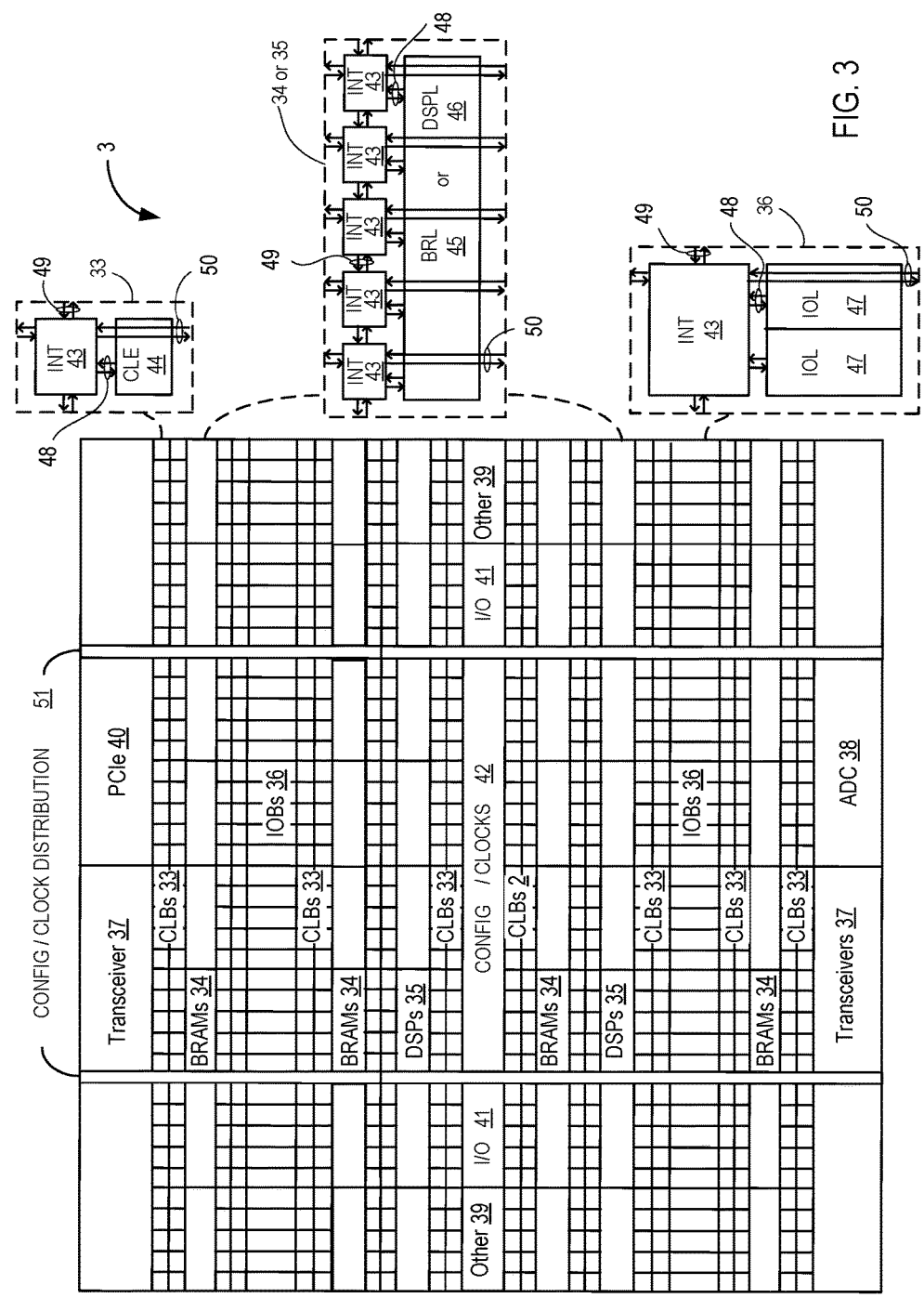
FIG. 3 illustrates a field programmable gate array (FPGA) implementation of the programmable IC of FIG. 1 according to an example.

FIG. 3 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like.

Figure 6:
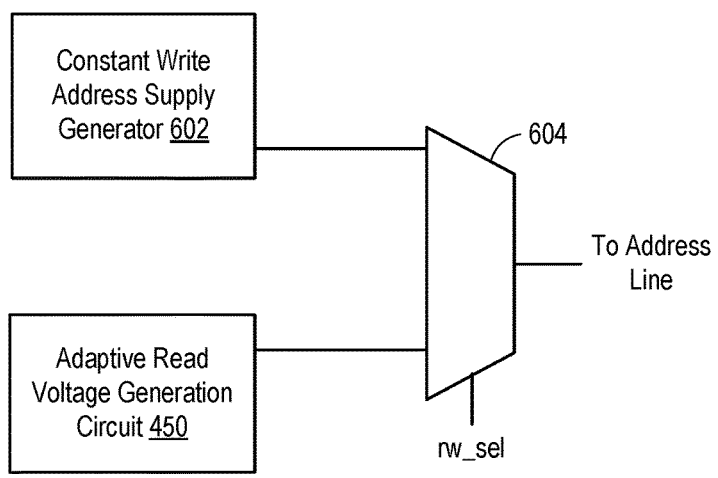
FIG. 6 is a block diagram depicting an address generation circuit for SRAM memory cells according to an example.

In some FPGAs, each programmable tile can include at least one programmable interconnect element ("INT") 43 having connections to input and output terminals 48 of a programmable logic element within the same tile, as shown by examples included at the top of FIG. 6. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 1) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 4:
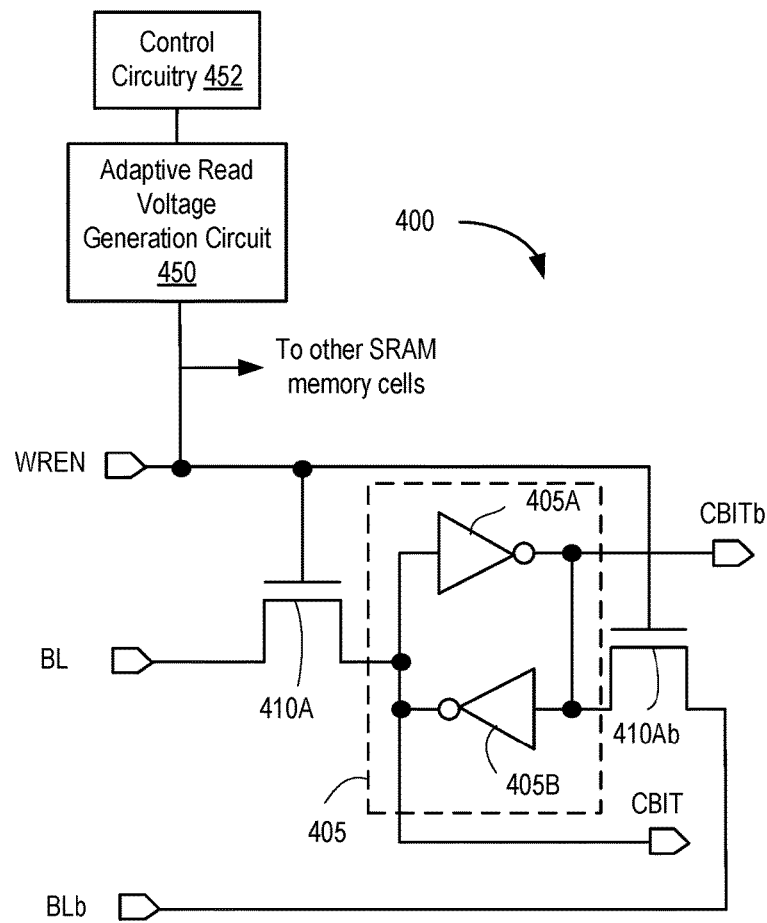
FIG. 4 is a block diagram depicting circuitry for accessing a SRAM memory cell according to an example.

FIG. 4 is a block diagram depicting circuitry for accessing a SRAM memory cell according to an example. The circuitry includes an SRAM memory cell 400, an adaptive read voltage generation circuit 450, and control circuitry 452. The SRAM memory cell 400 can be one memory cell in the configuration memory 26 described above. The adaptive read voltage generation circuit 450 can be coupled to a plurality of SRAM memory cells each constructed the same as the SRAM memory cell 400. The adaptive read voltage generation circuit 450 supplies a read address voltage to the SRAM memory cell 400. The adaptive read voltage generation circuit 450 adjusts the read address voltage dynamically based process, voltage and temperature using a feedback mechanism, as described further below. In general, the adaptive read voltage generation circuit 450 uses an emulation circuit in a feedback loop of an operational amplifier to generate a voltage required for reading the SRAM memory cell. The adaptive read voltage generation circuit 450 increases the read margin at every process corner as compared to constant read voltage generation across PVT. The control circuitry 452 provides control signals to the adaptive read voltage generation circuit (e.g., multiplexer control signals, as discussed below).

The SRAM memory cell 400 includes a transistor 410A, cross-coupled inverters 405, and a transistor 410Ab. The cross-coupled inverters 405 include an inverter 405A and an inverter 405B. Gates of the transistors 410A and 410Ab are coupled to an address line (WREN). A source of the transistor 410A is coupled to a read line (BL), and a source of the transistor 410B is coupled to an inverted read line (BLb). A drain of the transistor 410A is coupled to an input of the inverter 405A and an output of the inverter 405B. A drain of the transistor 410Ab is coupled to an output of the inverter 405A and an input of the inverter 405B. An output of the inverter 405A is coupled to an inverted output line (CBITb), and an output of the inverter 405B is coupled to an output line (CBIT). Each of the inverters 405A and 405B can be implemented using a conventional gate coupled pull-up and pull-down transistor pair. Hence, the SRAM memory cell 400 can be referred to as a 6-transistor (6T) SRAM memory cell. In general, the transistors 410A and 410Ab provide access to complementary bit nodes CBIT and CBITb of the cross-coupled inverters 405 when an enable signal on write/read enable terminal WREN is asserted.

During a write operation, complementary voltages representative of a specified logic level are presented on complementary bitlines BL and BLb while an enable signal on terminal WREN is asserted. The cross-coupled inverters 405 then retain the complementary voltages, and hence the specified logic level. During a read operation, an enable signal on terminal WREN connects bit nodes CBIT and CBITb to respective bitlines BL and BLb. Sense amplifiers (not shown) connected to the bitlines then sense the voltage levels provided on the bitlines by bit nodes CBIT and CBITb and provide a corresponding output signal. The inverters 405A and 405B require power to retain a logic level, and so lose stored data when powered down. As a consequence, programmable devices that employ the SRAM memory cell 400 to store configuration data are reconfigured each time power is applied.

FIG. 5 is a schematic diagram depicting the adaptive read voltage generation circuit 450 according to an example. The adaptive read voltage generation circuit 450 includes an operational amplifier 502, an operational amplifier 504, an emulation circuit 506, resistors 508 and 510, and a multiplexer 514. The emulation circuit 506 includes a transistor PG and a transistor PD.

A non-inverting input of the operational amplifier 502 is coupled to a reference voltage (Vbg) (e.g., a band-gap reference voltage). An inverting input of the operational amplifier 502 is coupled to a node 512. An output of the operational amplifier 502 is coupled to the node 512 through the resistor 508. The resistor 510 is coupled between the node 512 and electrical ground. An inverting input of the operational amplifier 504 is coupled to the node 518. A non-inverting input of the operational amplifier 504 is coupled to a node 512. An output of the operational amplifier 504 is coupled to a node 516. An input of the multiplexer 514 is coupled to receive a constant read voltage, and another input of the multiplexer 514 is coupled to the node 516. A control input of the multiplexer 514 receive a selection voltage (sel). An output of the multiplexer 514 provides a read voltage for an address line of SRAM memory cell(s).

A source of the transistor PG is coupled to a supply voltage VCC. A drain of the transistor PG is coupled to the node 518. A gate of the transistor PG is coupled to the node 518. A drain of the transistor PD is coupled to the node 518. A source of the transistor PD is coupled to electrical ground. A gate of the transistor PD is coupled to receive the supply voltage VCC.

In operation, the emulation circuit 506 emulates an SRAM memory cell, where transistor PG emulates a pass-gate transistor (e.g., the transistor 410A) and the transistor PD emulates a pull-down transistor of an inverter. The inverting input of the operational amplifier 504 is thus coupled to the internal node of the SRAM memory cell (e.g., the node between the drain of the pass gate and the cross-coupled inverters). The output of the operational amplifier 504 is coupled to the "address line" of the emulation circuit 506 (e.g., the gate of the PG transistor). The non-inverting input of the operational amplifier 504 receives a reference voltage from the node 512, which is adjustable based on the values of the resistors 508 and 510. In an example, one or both of the resistors 508 and 510 are adjustable so that the voltage at the node 512 can vary and be selected by the control circuitry 452 or by some other control mechanism (not shown). The control circuitry 452 controls the multiplexer 514 to select either the dynamic read voltage output on the node 516 or a constant read voltage. The dynamic read voltage is adjusted for PVT variations based on feedback from the emulation circuit 506.

FIG. 6 is a block diagram depicting an address generation circuit for SRAM memory cells according to an example. The address generation circuit includes a constant write address supply generator 602, the adaptive read voltage generation circuit 450, and a multiplexer 604. An input of the multiplexer 604 is coupled to an output of the constant write address supply generator 602, and another input of the multiplexer 604 is coupled to an output of the adaptive read voltage generation circuit 450. A control input of the multiplexer 604 is coupled to receive as control voltage (rw_sel) (e.g., generated by the control circuitry 452). An output of the multiplexer 604 is coupled to an address line of an SRAM memory cell. In operation, either a dynamic read voltage or a constant write voltage is applied to the address input of an SRAM cell depending on whether the SRAM cell is being read from or written to, respectively.

Figure 7:
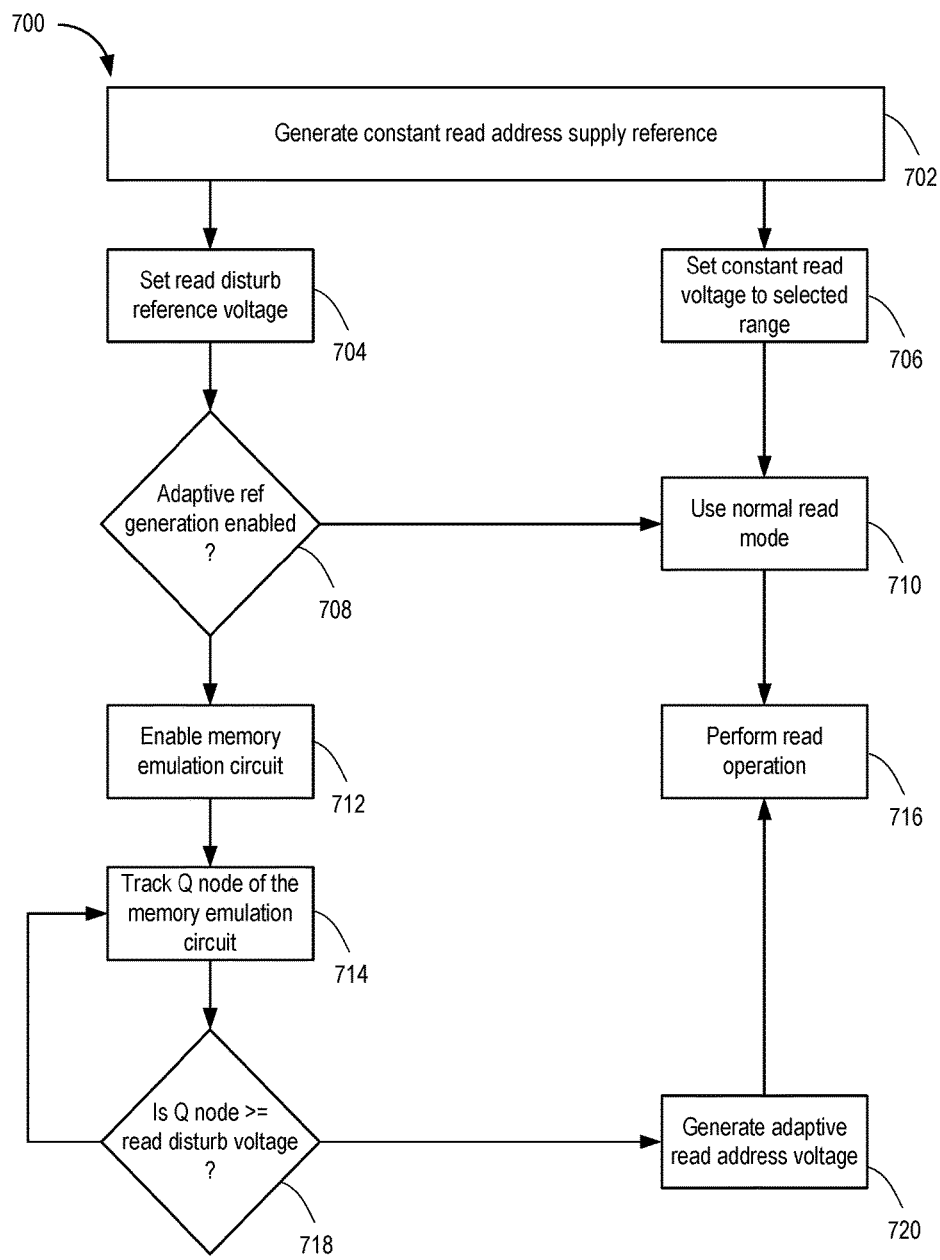
FIG. 7 is a flow diagram depicting a method of generating an address voltage for an SRAM memory cell according to an example.

FIG. 7 is a flow diagram depicting a method 700 of generating an address voltage for an SRAM memory cell according to an example. The method 700 begins at step 702, where a constant read address voltage is generated. At step 704, the control circuitry 452 sets the reference voltage at the node 512 ("read disturb voltage") to a selected voltage within a particular range (depending on the values of the resistors 508 and 510). At step 706, the control circuitry 452 sets the constant read voltage to a selected voltage within a particular range. At step 708, the control circuitry 452 determines if adaptive read voltage generation is enabled. If not, the method 700 proceeds to step 710, where the normal read mode is enabled. From step 710, the method 700 proceeds to step 716, where a read operation is performed on the SRAM memory cell.

If at step 708 adaptive read voltage generation is enabled, the method 700 proceeds from step 708 to step 712. At step 712, the emulation circuit 506 is enabled. At step 714, the voltage at the node 518 is tracked ("the Q node"), which varies the voltage at the node 516. At step 718, the operational amplifier 504 continues to track the voltage at the node 518 until the voltage at the node 518 is greater than or equal to the voltage at the node 512. At that point, the method 700 proceeds to step 720, where the adaptive read address voltage is generated. From step 720, a read operation is performed on the SRAM memory cell using the adaptive read address voltage.

While the foregoing is directed to specific examples, other and further examples may be devised without departing from the basic scope thereof, and the scope thereof is determined by the claims that follow.

What is claimed is:

1. A read address generation circuit for a static random access memory (SRAM) cell, comprising:
    an operational amplifier having a non-inverting input coupled to a reference voltage;
    a memory emulation circuit having an output coupled to an inverting input of the operational amplifier and a control input coupled to an output of the operational amplifier; and
    a multiplexer having a first input coupled to receive a constant read voltage, a second input coupled to the output of the operational amplifier, and an output coupled to supply a read address voltage to the SRAM cell.

2. The read address generation circuit of claim 1, further comprising:
    another operational amplifier having a non-inverting input coupled to receive an external reference voltage, and an inverting input coupled to the non-inverting input of the operational amplifier.

3. The read address generation circuit of claim 2, further comprising:
    a first resistor coupled between an output of the other operational amplifier and the non-inverting input of the operational amplifier; and
    a second resistor coupled between the non-inverting input of the operational amplifier and electrical ground.

4. The read address generation circuit of claim 1, wherein the memory emulation circuit comprises:
    a first transistor having a source coupled to a source voltage, a gate coupled to the output of the operational amplifier, and a drain coupled to the inverting input of the operational amplifier.

5. The read address generation circuit of claim 4, wherein the memory emulation circuit comprises:
    a second transistor having a drain coupled to the inverting input of the operational amplifier, a gate coupled to the supply voltage, and a source coupled to electrical ground.

6. The read address generation circuit of claim 1, further comprising:
    control circuitry coupled to a control input of the multiplexer.

7. A circuit, comprising:
    a static random access memory (SRAM) cell having an address input;
    an operational amplifier having a non-inverting input coupled to a reference voltage;
    a memory emulation circuit having an output coupled to an inverting input of the operational amplifier and a control input coupled to an output of the operational amplifier; and
    a multiplexer having a first input coupled to receive a constant read voltage, a second input coupled to the output of the operational amplifier, and an output coupled to the address input of the SRAM cell.

8. The circuit of claim 7, further comprising:
    another operational amplifier having a non-inverting input coupled to receive an external reference voltage, and an inverting input coupled to the non-inverting input of the operational amplifier.

9. The circuit of claim 8, further comprising:
    a first resistor coupled between an output of the other operational amplifier and the non-inverting input of the operational amplifier; and
    a second resistor coupled between the non-inverting input of the operational amplifier and electrical ground.

10. The circuit of claim 7, wherein the memory emulation circuit comprises:
    a first transistor having a source coupled to a source voltage, a gate coupled to the output of the operational amplifier, and a drain coupled to the inverting input of the operational amplifier.

11. The circuit of claim 10, wherein the memory emulation circuit comprises:
    a second transistor having a drain coupled to the inverting input of the operational amplifier, a gate coupled to the supply voltage, and a source coupled to electrical ground.

12. The circuit of claim 7, further comprising:
    control circuitry coupled to a control input of the multiplexer.

13. The circuit of claim 7, wherein the SRAM memory cell comprises:
    a first transistor having a gate coupled to the address input, a source coupled to a first data line, and a drain;
    a second transistor having a gate coupled to the address input, a source coupled to a second data line, and a drain; and
    a pair of cross-coupled inverters coupled between the drains of the first and second transistors.

14. A programmable device, comprising:
    programmable logic;
    configuration memory;

configuration logic configured to load data into the configuration memory for programming the programmable logic;

a static random access memory (SRAM) cell in the configuration memory;

an operational amplifier having a non-inverting input coupled to a reference voltage;

a memory emulation circuit having an output coupled to an inverting input of the operational amplifier and a control input coupled to an output of the operational amplifier; and a multiplexer having a first input coupled to receive a constant read voltage, a second input coupled to the output of the operational amplifier, and an output coupled to the address input of the SRAM cell.

15. The programmable device of claim 14, further comprising:

another operational amplifier having a non-inverting input coupled to receive an external reference voltage, and an inverting input coupled to the non-inverting input of the operational amplifier.

16. The programmable device of claim 15, further comprising:

a first resistor coupled between an output of the other operational amplifier and the non-inverting input of the operational amplifier; and a second resistor coupled between the non-inverting input of the operational amplifier and electrical ground.

17. The programmable device of claim 14, wherein the memory emulation circuit comprises:

a first transistor having a source coupled to a source voltage, a gate coupled to the output of the operational amplifier, and a drain coupled to the inverting input of the operational amplifier.

18. The programmable device of claim 17, wherein the memory emulation circuit comprises:

a second transistor having a drain coupled to the inverting input of the operational amplifier, a gate coupled to the supply voltage, and a source coupled to electrical ground.

19. The programmable device of claim 15, further comprising:

control circuitry coupled to a control input of the multiplexer.

20. The programmable device of claim 15, wherein the SRAM memory cell comprises:

a first transistor having a gate coupled to the address input, a source coupled to a first data line, and a drain;

a second transistor having a gate coupled to the address input, a source coupled to a second data line, and a drain; and a pair of cross-coupled inverters coupled between the drains of the first and second transistors.

* * * * *